(12) United States Patent
Gao et al.

(10) Patent No.: US 10,069,006 B2
(45) Date of Patent: Sep. 4, 2018

(54) SEMICONDUCTOR DEVICE WITH VERTICAL FIELD FLOATING RINGS AND METHODS OF FABRICATION THEREOF

(71) Applicant: NXP USA, Inc., Austin, TX (US)

(72) Inventors: Zihao M. Gao, Gilbert, AZ (US); David C. Burdeaux, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/596,525

(22) Filed: May 16, 2017

(65) Prior Publication Data

US 2017/0250276 A1    Aug. 31, 2017

Related U.S. Application Data

(63) Continuation of application No. 14/715,706, filed on May 19, 2015, now Pat. No. 9,666,710.

(51) Int. Cl.
*H01L 29/78* (2006.01)
*H01L 29/40* (2006.01)
(Continued)

(52) U.S. Cl.
CPC ...... *H01L 29/7816* (2013.01); *H01L 29/0611* (2013.01); *H01L 29/0623* (2013.01);
(Continued)

(58) Field of Classification Search
CPC ............. H01L 29/7816; H01L 29/0623; H01L 29/4175; H01L 29/1083; H01L 29/0611; H01L 29/66681; H01L 29/404
(Continued)

(56) References Cited

U.S. PATENT DOCUMENTS 5,460,986 A    10/1995  Tam et al.
8,314,000 B2   11/2012  Hsieh
(Continued)

OTHER PUBLICATIONS

Sung, "High-Side N-channel LDMOS for a High Breakdown Voltage", Journal of the Korean Physical Society, May 2011, pp. 1411-1416, vol. 58, No. 5.
(Continued)

*Primary Examiner* — Fernando L Toledo
*Assistant Examiner* — Adam S Bowen
(74) *Attorney, Agent, or Firm* — Sherry W. Schumm

(57) ABSTRACT

A semiconductor device includes a semiconductor substrate having a first conductivity type. A gate structure is supported by a surface of the semiconductor substrate, and a current carrying region (e.g., a drain region of an LDMOS transistor) is disposed in the semiconductor substrate at the surface. The device further includes a drift region of a second, opposite conductivity type disposed in the semiconductor substrate at the surface. The drift region extends laterally from the current carrying region to the gate structure. The device further includes a buried region of the second conductivity type disposed in the semiconductor substrate below the current carrying region. The buried region is vertically aligned with the current carrying region, and a portion of the semiconductor substrate with the first conductivity type is present between the buried region and the current carrying region.

20 Claims, 6 Drawing Sheets

(51) Int. Cl.
H01L 29/417 (2006.01)
H01L 29/66 (2006.01)
H01L 29/06 (2006.01)
H01L 29/10 (2006.01)

(52) U.S. Cl.
CPC ...... H01L 29/1083 (2013.01); H01L 29/1095 (2013.01); H01L 29/404 (2013.01); H01L 29/4175 (2013.01); H01L 29/66681 (2013.01)

(58) Field of Classification Search
USPC ........................................................ 257/339
See application file for complete search history.

(56) References Cited

U.S. PATENT DOCUMENTS

| 8,592,274 | B2 | 11/2013 | Tsuchiko |
| 8,680,615 | B2 | 3/2014 | Mitra et al. |
| 2003/0080381 | A1* | 5/2003 | Parthasarathy ....... H01L 21/761 257/338 |
| 2004/0238854 | A1 | 12/2004 | Krumbein et al. |
| 2009/0085113 | A1* | 4/2009 | Izumi .................. H01L 29/0623 257/343 |
| 2010/0006936 | A1 | 1/2010 | Matsuda et al. |
| 2010/0078772 | A1* | 4/2010 | Robinson .............. H01L 23/481 257/621 |
| 2010/0078775 | A1 | 4/2010 | Mauder et al. |
| 2011/0266614 | A1 | 11/2011 | Khan et al. |
| 2013/0146973 | A1* | 6/2013 | Mitra .................. H01L 29/7835 257/335 |
| 2016/0035822 | A1 | 2/2016 | Renaud et al. |
| 2016/0181378 | A1 | 6/2016 | Gao et al. |

OTHER PUBLICATIONS

Shan, "Design of 700 V triple RESURF nLDMOS with low on-resistance", Journal of Semiconductors, Nov. 2011, pp. 114002-1 through 114002-4, vol. 32, No. 11.

Extended European Search Report for Patent Appln. No. 16170099.2 (Oct. 4, 2016) [sic].

* cited by examiner

US 10,069,006 B2

SEMICONDUCTOR DEVICE WITH VERTICAL FIELD FLOATING RINGS AND METHODS OF FABRICATION THEREOF

RELATED APPLICATION

This application is a continuation of co-pending, U.S. patent application Ser. No. 14/715,706, filed on May 19, 2015.

TECHNICAL FIELD

Embodiments relate generally to semiconductor devices, and more specifically to lateral semiconductor devices, such as laterally diffused metal oxide semiconductor (LDMOS) field effect transistors (FETs).

BACKGROUND

Integrated circuits (ICs) and other electronic devices often include arrangements of interconnected field-effect transistors (FETs), also called metal-oxide-semiconductor field-effect transistors (MOSFETs), or simply MOS transistors or devices. A typical MOS transistor includes a gate electrode and spaced-apart source and drain electrodes. A control voltage applied to the gate electrode controls the flow of current through a variably conductive channel between the source and drain electrodes.

Power transistor devices are designed to be tolerant of the high currents and voltages that are present in some applications. Some power transistor devices are also designed to handle radio frequency (RF) signals, such as the devices used in wireless communications and other RF power amplifier applications. One type of RF power transistor device is a laterally diffused metal-oxide-semiconductor (LDMOS) transistor. In an LDMOS device, charge carriers drift through a drift space between a channel region and the drain electrode under the electric field arising from an operating voltage applied between the source and drain electrodes.

The output power density and linear efficiency of an RF LDMOS transistor is affected by the transistor's drain-source capacitance, ($C_{ds}$), drain-gate capacitance ($C_{dg}$), on-state drain-to-source resistance ($R_{dson}$), and source-to-drain breakdown voltage ($BV_{dss}$). Generally, there is a desire in the industry to develop RF LDMOS transistors with higher power densities and improved linear efficiencies. Accordingly, there is a desire in the industry to develop RF LDMOS transistors with lower $C_{ds}$, $C_{dg}$, and $R_{dson}$, and higher $BV_{dss}$.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
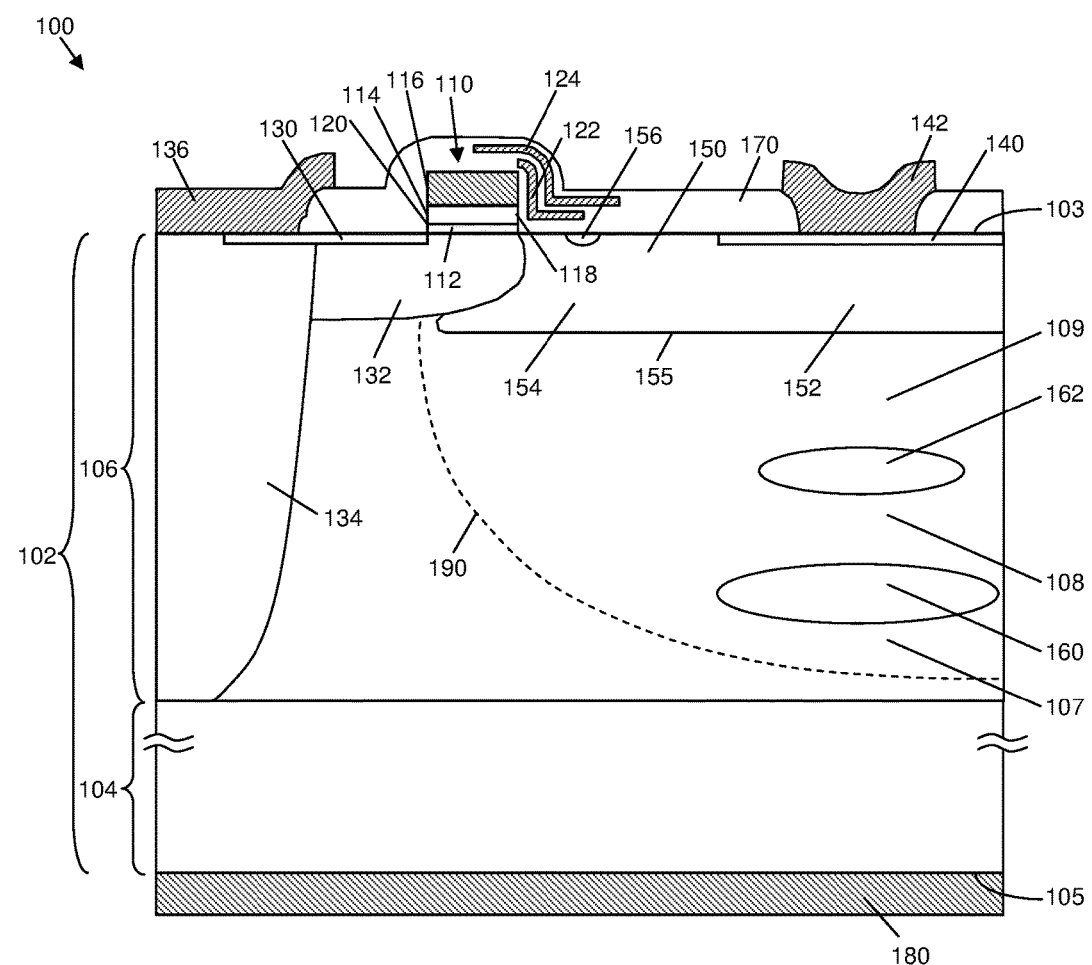
FIG. 1 is a cross-sectional side view of an exemplary semiconductor device in accordance with an embodiment.

An embodiment of an LDMOS transistor includes a substrate having a first conductivity type, and at least one buried region having a second conductivity type in a portion of the substrate that is below and vertically aligned with a drain region of the transistor. During device operation, the buried region(s) help to stretch the depletion line deeper into the semiconductor substrate than may be achieved using a conventional device that lacks the aforementioned buried region(s). Because drain-to-gate capacitance (Cdg) and drain-to-source capacitance (Cds) are inversely proportional to depletion depth, LDMOS devices with such buried region(s) may have a relatively low drain-to-gate capacitance (Cdg) and drain-to-source capacitance (Cds), when compared with conventional devices. In addition, LDMOS devices with such buried region(s) also may have a relatively high source-to-drain breakdown voltage (BVdss) and relatively low on-state drain-to-source resistance (Rdson), when compared with conventional devices.

According to a further embodiment, an LDMOS device also may have a relatively deep high voltage region of a conductivity type opposite the substrate conductivity type (e.g., an n-type or NHV region) buried under the drain contact and extending towards the gate. For example, in an embodiment, a deep high voltage region is merged with a shallow high voltage region in order to form a drift region. The relatively deep, composite high voltage region may enable a conventional scaling plateau between BVdss and drift length to be broken, resulting in a higher BVdss while keeping Rdson relatively low, when compared with conventional devices that lack such a high voltage region.

According to another further embodiment, an LDMOS device may have an additional high density implant in the NHV drift region below a gate shield plate. This additional implant, referred to herein as a "shield plate dopant region," may increase the charge density in the drift region, thus improving drift region resistance and reducing Rdson. Not only is the implant potentially helpful in reducing Rdson, but the implant also may be effective in increasing BVdss.

Throughout this description and in the appended claims, the term "buried" as used in reference to a dopant and/or a doped region refers to the dopant or at least a portion of the doped region being present at a depth below a semiconductor substrate surface that is greater than a depth achievable via standard ion implantation. As used herein, the phrase "standard ion implantation" refers to conventional methods known in the industry as of the filing date of this patent application. In some embodiments, the term "buried" describes a depth greater than about 1 micron beneath a top surface of a semiconductor substrate. In some embodiments, the depth is greater than about 3.0 microns, in some embodiments greater than about 6.0 microns, in some embodiments greater than about 9.0 microns, in some embodiments greater than about 12.0 microns, and in some embodiments greater than about 15.0 microns.

Although described below in connection with n-channel LDMOS transistors, the disclosed devices are not limited to any particular transistor configuration. N-channel LDMOS devices are described and illustrated herein for convenience of description and without any intended limitation. The device embodiments are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a cross-sectional side view of an example of an n-channel LDMOS device 100 constructed in accordance with an embodiment. The device 100 may be configured for operation as an RF LDMOS transistor device. The device 100 includes a semiconductor substrate 102 having a first conductivity type, a gate structure 110 supported by a first surface 103 of the semiconductor substrate 102, and source and drain regions 130, 140 (or more generally "current-carrying regions") on either side of the gate structure 110. The drain region 140 is laterally separated from the gate structure 110 across the first surface 103, and a drift region 150 of a second (opposite) conductivity type extends laterally from the drain region 140 to the gate structure 110. According to an embodiment, the device 100 also includes one or more buried regions 160, 162 of the second conductivity type disposed in the semiconductor substrate 102 directly below and vertically aligned with the drain region 140, as will be described in more detail below.

The semiconductor substrate 102 includes a base semiconductor layer 104 and a plurality of epitaxial layers 106. The base semiconductor layer 104 may include silicon or another semiconductor material, which is heavily doped with one or more dopants having the first conductivity type to render the base semiconductor layer 104 degenerate (e.g., a doping concentration in a range of about $3\times10^{18}$ cm$^{-3}$ to $2\times10^{19}$ cm$^{-3}$), and to provide for conductivity through the base semiconductor layer 104 to a backside contact 180 on a second surface 105 of the substrate 102. According to an embodiment, the dopant concentration for the base semiconductor layer 104 is sufficient to achieve a relatively low substrate resistivity in a range of about 7 ohm-cm to about 11 ohm-cm, although the dopant concentration may be selected to achieve lower or higher resistivity, as well. In alternate embodiments, base semiconductor layer 104 may be moderately doped, lightly doped, or undoped. In still another alternate embodiment, the base semiconductor layer 104 may have a silicon-on-insulator (SOI) structure.

The epitaxial layers 106 also may be doped with dopant(s) of the first conductivity type. For example, the epitaxial layers 106 are more lightly doped than the base semiconductor layer 104 (e.g., the epitaxial layers 106 may have a doping concentration in a range of about $1.3\times10^{15}$ cm$^{-3}$ to $1.9\times10^{15}$ cm$^{-3}$). According to a specific embodiment, the semiconductor substrate 102 includes a plurality of moderately doped p-type epitaxial layers 106 (e.g., p or p-) grown on a heavily doped p-type base semiconductor layer 104 (e.g., p+ or p++). In such an embodiment, the base semiconductor layer 104 and the epitaxial layers 106 may be doped with a p-type dopant such as boron (B).

A device area is depicted in FIG. 1. The device area may include or correspond with one or more active areas of the device 100. In some embodiments, the device area is defined by one or more doped isolating regions (not shown) in the semiconductor substrate 102 (e.g., in the epitaxial layers 106). The doped isolating region(s) may surround the device area. These regions act as a barrier separating the device area from other portions of the substrate 102 (or the base semiconductor layer 104). For example, the device area may be further defined via a moderately or heavily doped n-type isolating well laterally surrounding the device area. The isolating well may be ring-shaped. The device area may alternatively or additionally be defined by one or more isolation regions, such as a shallow trench isolation (STI) region, a deep trench isolation (DTI) region, or a field oxide region (fieldox).

The device 100 includes a well or diffused region 132 in the semiconductor substrate 102. During operation, a channel or channel region is formed in the well region 132 at a surface 103 of the semiconductor substrate 102. The channel is formed under a gate structure 110 of the device 100 via application of a bias voltage to a conductive portion (e.g., polysilicon layer 114) of the gate structure 110. The well region 132 may be a region formed by lateral diffusion under the gate structure 110. The well region 132 may be considered a body or base region of the device 100. In this example, the well region 132 has the first conductivity type (e.g., p-type), and is formed in the uppermost epitaxial layer (e.g., epitaxial layer 506, FIG. 5) of the semiconductor substrate 102. The p-type well region 132 is more heavily doped than the uppermost epitaxial layer (e.g., the well region 132 may have a doping concentration in a range of about $3\times10^{16}$ cm$^{-3}$ to $5\times10^{17}$ cm$^{-3}$). The well region 132 may be configured to establish a desired threshold voltage and/or other operational parameters of the device 100. For example, the dopant concentration level and the depth of the well region 132 may be configured to set the threshold voltage.

The gate structure 110 is formed on or above the semiconductor substrate 102 over the well region 132. The gate structure 110 includes an oxide or other dielectric layer 112 disposed on the surface 103. For example, the dielectric layer 112 may include silicon dioxide (or oxide) deposited or otherwise formed on the surface 103. The gate structure 110 may include any number of dielectric layers. The dielectric layer spaces a polysilicon or other conductive layer 114 of the gate structure 110 from the well region 132. One or more metal interconnect layers 116 may, in turn, be disposed on the polysilicon layer 114. The materials, shape, construction, and other characteristics of the gate structure 110 may vary. For example, the lateral extent to which the well region 132 extends under the gate structure 110 may vary from the example shown. The gate structure 110 may include additional components. For example, the gate structure 110 may include one or more dielectric sidewall spacers disposed along lateral edges 118, 120 of the gate structure 103. The sidewall spacers may cover the lateral edges 118, 120 to act as a silicide block to prevent a silicide short along the surface 103. Further, the sidewall spacers may provide spacing to separate the conductive components of the gate structure 110 from other structures or components of the device 100. One or more of the sidewall spacers may alternatively or additionally be used for alignment purposes in defining an edge of one or more regions of the device 100. The edges of one or more other regions may be aligned with the gate structure 110 as described below.

The device 100 also includes a heavily doped source region 130 and a drain region 140 of the second conductivity type in the semiconductor substrate 102. For example, in an embodiment, the source region 130 and drain region 140 may be doped with an n-type dopant such as arsenic (As), phosphorus (P), or antimony (Sb). The source region 130 and the drain region 140 are laterally spaced from one another at the surface 103 of the semiconductor substrate 102, and the gate structure 110 is supported by the semiconductor substrate 102 between the source region 130 and the drain region 140. The source region 130 may be disposed along or aligned with a first sidewall 120 of the gate structure 110, whereas the drain region 140 is laterally separated across the surface 103 of the substrate 102 from a second, opposite sidewall 118 of the gate structure 110. In some embodiments, the source region 130 and the drain region 140 may have additional or alternative lateral spacing. Any number of source regions 130 and drain regions 140 may be provided. For example, the drain region 140 may be centered or otherwise disposed between, or laterally surrounded by, two portions of the source region 130 or two separate source regions. For example, the device 100 may be configured as a single transistor with a dual gate finger configuration. In this example, the source region 130 and the drain region 140 are n-type doped portions of the uppermost epitaxial layer (e.g., epitaxial layer 506, FIG. 5). The heavily doped n-type source region 130 is adjacent the well region 132. The heavily doped n-type drain region 140 is spaced from the source 130 and the well 132. Such spacing defines a conduction path of the device between the source region 130 and the drain region 140. The source region 130 and the drain region 140, or a portion thereof, may have a dopant concentration at a level sufficient to establish ohmic contacts with electrodes or interconnects 136 and 142, for biasing or applying voltages to the source region 130 and the drain region 140, respectively. During operation, the drain region 140 may be biased or otherwise disposed at a relatively high drain-source voltage (Vds) relative to the source region 130.

Device 100 also may include a sinker region 134, which extends from the source electrode 136, through the epitaxial layers 106 to the base semiconductor layer 104. The sinker region 134 may be configured as a relatively heavily doped region of the first conductivity type (e.g., p-type) to establish an electrical connection between the source electrode 136 (and, thus, the source region 130) and the base semiconductor layer 104. In an embodiment in which the base semiconductor layer 104 is conductive (e.g., heavily doped), the sinker region 134 further provides a conductive path to a backside or back surface 105 of the semiconductor substrate 102 on which a backside contact 180 (e.g., formed of metal or other conductive material) is deposited or otherwise disposed. The backside contact 180 may form an Ohmic contact with the base semiconductor layer 104 to complete the electrical connection between the source region 130 and the backside contact 180. In an alternate embodiment, rather than relying on sinker region 134 to provide a conductive path from the source electrode 136 to the base semiconductor layer 104, device 100 may include conductive vias ("blind vias") between the top surface 103 of the substrate 102 through epitaxial layers 106 to the base semiconductor substrate 104, where the conductive vias may be electrically connected with the source region 130. In still another alternate embodiment, device 100 may include conductive through substrate vias (TSVs) that extend the entire distance between the top and bottom substrate surfaces 103, 105, and opposite ends of the TSVs may be electrically coupled with the source region 130 and the backside contact 180, respectively.

When the gate structure 110 is biased, charge carriers (in some embodiments, electrons; in other embodiments, holes) accumulate in a region at or near the surface 103 under or below the gate structure 110, thereby forming a channel that electrically extends from the source region 130 toward the drain region 140. The channel region is located in the well region 132 and other p-type portions of the semiconductor substrate 102 under the gate structure 110. The accumulation of charge carriers (e.g., electrons) results in a majority charge carrier inversion in the channel region from the p-type well region 132 (or uppermost epitaxial layer) to an n-type conduction layer or area near the surface 103 of the semiconductor substrate 102. Once a sufficient amount of the charge carriers (e.g., electrons) accumulate in the channel region, charge carriers (e.g., electrons) are capable of flowing along a conduction path from the source region 130 to the drain region 140.

The device 100 also includes a drift region 150 in the semiconductor substrate 102 between the well region 132 and the drain region 140 in accordance with an embodiment. The drift region 150 includes a first lateral section 152 adjacent to (e.g., under and/or next to) the drain region 140 and a second lateral section 154 adjacent to (e.g., next to, and either touching or not touching) the well section 132. In the illustrated embodiment, the depth of the lower boundary 155 of the drift region 150 is greater than a depth of the well region 132. In an alternate embodiment, the depth of the lower boundary 155 of the drift region 150 may be less than the depth of the well region 132.

According to an embodiment, the drift region 150 is established via the formation of an n-type well. The n-type well may be configured for high voltage device operation, and may thus be referred to as an n-type high-voltage (NHV) well. For example, the portion of the drift region 150 underlying the drain region 140 may have a dopant concentration lower than the dopant concentration of the source region 130 and the drain region 140 to support high voltage device operation. The drift region 150 may support the creation of an accumulation region under the gate structure 110. In this example, the drift region 150 extends up to or under a drain-side portion or sidewall 118 of the gate structure 110. The drift region 150 laterally extends from the drain-side sidewall 118 of the gate structure 110 to the drain region 140, which may be formed in or otherwise on the drift region 150. The lateral extension of the drift region 150 allows charge carriers (e.g., electrons) in the channel region to reach the drain region 140 during operation. The lateral extent of the drift region 150 may vary. For example, although FIG. 1 illustrates a drift region 150 that abuts the well region 132, in an alternate embodiment, an area of epitaxial layer 106 material may be present between the well region 132 and the drift region 150. The depth, size, and other characteristics of the drift region 150 may vary.

The device 100 may include one or more Faraday or other shield plates 122, 124 disposed along or over a portion of the drift region 150 and a drain-side edge or sidewall 118 of the gate structure 110. The device 100 may include one or more passivation layers 170 covering the surface 103. In some embodiments, the shield plate(s) 122, 124 are disposed between adjacent dielectric or passivation layers 170. The shield plate(s) 122, 124 may help protect the dielectric layer 112 of the gate structure 110 from damage or degradation arising from charge carriers accelerated under the electric field arising from the drain-source voltage. The shield plate(s) 122, 124 may also help to reduce the maximum electric field in the drift region 150. The shield plate(s) 122, 124 may be grounded or otherwise biased to deter injection of such hot carriers into the oxide or other dielectric material under the gate structure 110 and/or the oxide or other dielectric material over the drift region 150.

According to an embodiment, the device 100 also includes a shield plate dopant region 156 of the second conductivity type (e.g., n-type) formed in the drift region 150 at a portion of the surface 103 of the substrate 102 just below the shield plate(s) 122, 124. The shield plate dopant region 156 has a higher dopant concentration than the drift region 150, or more particularly than the second lateral section 154 of the drift region 150. For example, the shield plate dopant region 156 may have a doping concentration in a range of about $1 \times 10^{16}$ $cm^{-3}$ to $9.5 \times 10^{16}$ $cm^{-3}$.

According to an embodiment, the shield plate dopant region 156 is positioned a gap distance away from the drain-side sidewall 118 of the gate structure 110, which may help to avoid hot carrier injection issues in the device 100. For example, the gap distance may be less than half the length of the second lateral section 154 of the drift region 150. Further, a width of the shield plate dopant region 156 may be relatively small compared with the length of the second lateral section 154 of the drift region.

As discussed above, the device 100 also includes one or more buried regions 160, 162 of the second conductivity type underlying the drain region 140. For example, the buried regions 160, 162 may have a doping concentration in a range of $1.8 \times 10^{15}$ cm$^{-3}$ to $2.1 \times 10^{15}$ cm$^{-3}$, although the doping concentration may be higher or lower, as well. Further, the buried regions 160, 162 may have substantially the same doping concentration, or significantly different doping concentrations from each other. According to an embodiment, a first portion 107 of the semiconductor substrate 102 with the first conductivity type is present between the lowest buried region 160 and the base semiconductor layer 104, a second portion 108 of the semiconductor substrate 102 with the first conductivity type is present between buried regions 160, 162, and a third portion 109 of the semiconductor substrate 102 with the first conductivity type is present between the uppermost buried region 162 and the drain region 140 (or the first lateral section 152 of the drift region 150). In FIG. 1, the lowest buried region 160 has a width that is greater than a width of the uppermost buried region 162. In alternate embodiments, the buried regions 160, 162 may have substantially the same width, or the uppermost buried region 162 may be wider than the lowest buried region 160.

Buried regions 160, 162 may be electrically floating structures, in an embodiment, meaning that buried regions 160, 162 essentially are electrically isolated from other current carrying structures or regions. In an alternate embodiment, either or both of buried regions 160, 162 may be contacted by a conductive via or by a sinker region of the second conductivity type, which electrically couples the buried region(s) 160, 162 with the top surface 103 of the substrate 102. In such embodiments, a bias voltage may be applied to the buried region(s) 160, 162 to actively alter their influence on the operation of device 100.

During device operation, the buried regions 160, 162 help to stretch the depletion line (e.g., indicated by line 190) deeper into the semiconductor substrate 102 than may be achieved using a similarly-constructed device that lacks buried regions 160, 162. Accordingly, device 100 may have a relatively low drain-to-gate capacitance (Cdg) and drain-to-source capacitance (Cds), when compared with such a device, as well as a relatively high source-to-drain breakdown voltage (BVdss) and relatively low on-state drain-to-source resistance (Rdson).

Along with a detailed description of an embodiment of a method for forming buried regions 160, 162, embodiments of absolute and relative dimensions and positions of the buried regions 160, 162 will be discussed in more detail in conjunction with FIGS. 3-6. Although device 100 is shown to include two buried regions 160, 162, alternate embodiments may include a single buried region, multiple merged buried regions, or more than two distinct buried regions.

The device 100 is shown in simplified form in FIG. 1. For example, FIG. 1 does not depict a number of metal layers configured for electric connections with the source region 130, the drain region 140, and the gate structure 110. The device 100 may have a number of other structures or components for connectivity, isolation, passivation, and other purposes not shown in FIG. 1 for ease in illustration. For instance, the device 100 may include any number of isolating regions or layers. Any number of STI regions, DTI regions or fieldox regions may be formed at the surface 103 of the semiconductor substrate 102. Other STI regions may be disposed in the semiconductor substrate 102 within the active device area to isolate or separate various contact regions.

The device 100 may be configured with one or more lightly or intermediately doped transition regions (e.g., n-type lightly doped drain, or NLDD, regions) at or near the source region 130 and the drain region 140. Each transition region may be or include a diffused region formed in connection with the source region 130 and/or the drain region 140 and may thus be referred to herein as a source/drain extension region. Such transition regions may assist in controlling the electric field at or near the surface 103, including in areas other than those areas near the source region 130 or the drain region 140.

The dopant concentrations, thicknesses, and other characteristics of the above-described semiconductor regions in the semiconductor substrate 102 may vary. For example, the dopant concentration of the base semiconductor layer 104 may vary considerably. The dopant concentrations and/or depths may have values larger or smaller than the values or ranges provided herein.

Figure 2:
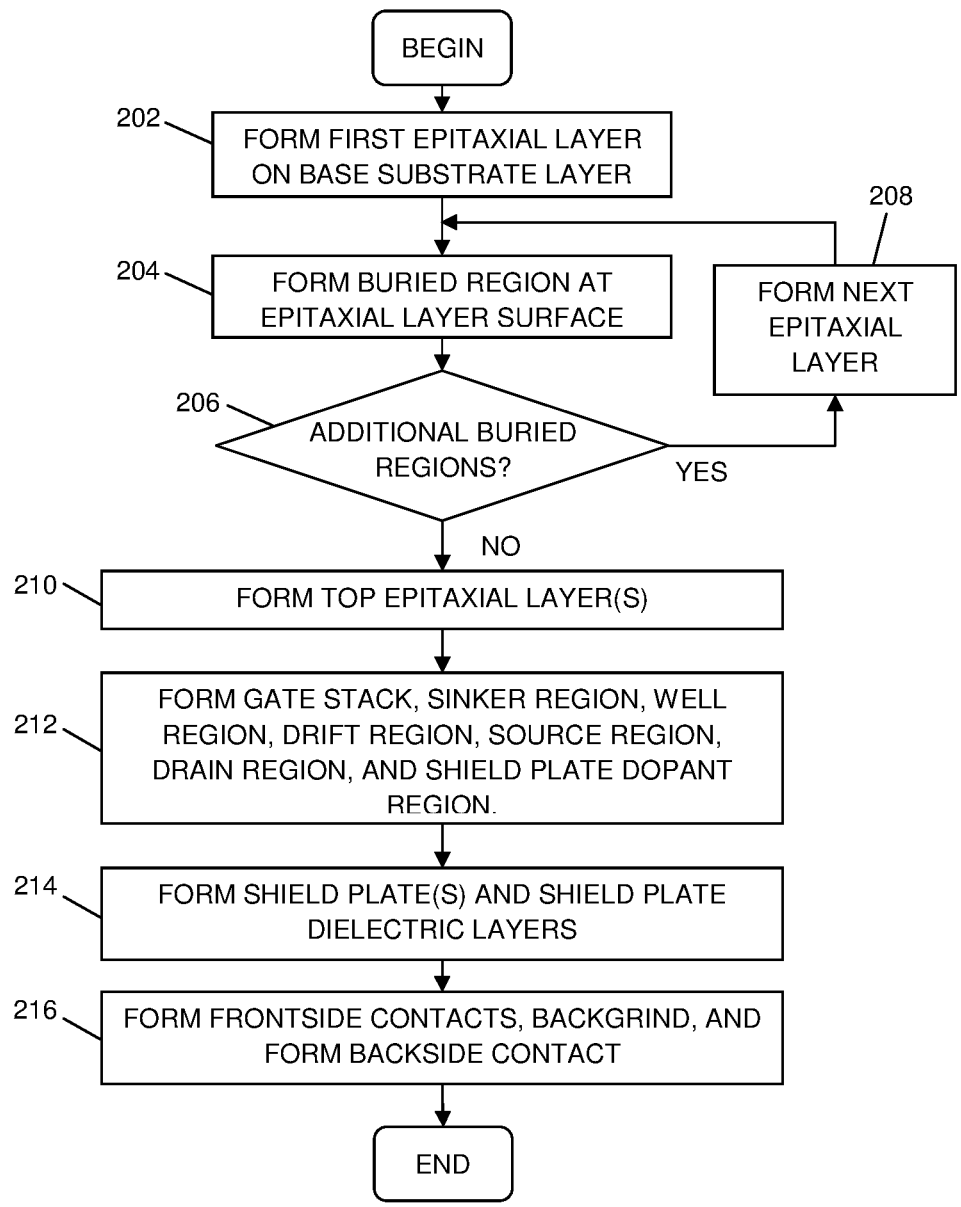
FIG. 2 is a flowchart of a method of fabricating a semiconductor device in accordance with an embodiment.

FIG. 2 is a flowchart of a method of fabricating a semiconductor device (e.g., device 100) in accordance with an embodiment. FIG. 2 should be viewed in conjunction with FIGS. 3-6, which are cross-sectional side views of the device of FIG. 1 during various fabrication stages in accordance with an embodiment. The transistor device is fabricated with a semiconductor substrate, the regions or layers of which may have the conductivity types of the n-channel example described above, or a device alternatively may be configured to support a p-channel device. The method includes a sequence of acts, only the salient of which are depicted for convenience in illustration. It is to be understood that the relative ordering of some acts shown in the flowchart of FIG. 2 is meant to be merely representative rather than limiting, and that alternative sequences may be followed. Moreover, it is likewise to be understood that additional, different, or fewer acts may be provided, and that two or more of these acts may occur sequentially, substantially contemporaneously, and/or in alternative orders. The fabrication method is not limited to any particular doping mechanism, and may include future developed doping techniques.

Figure 3:
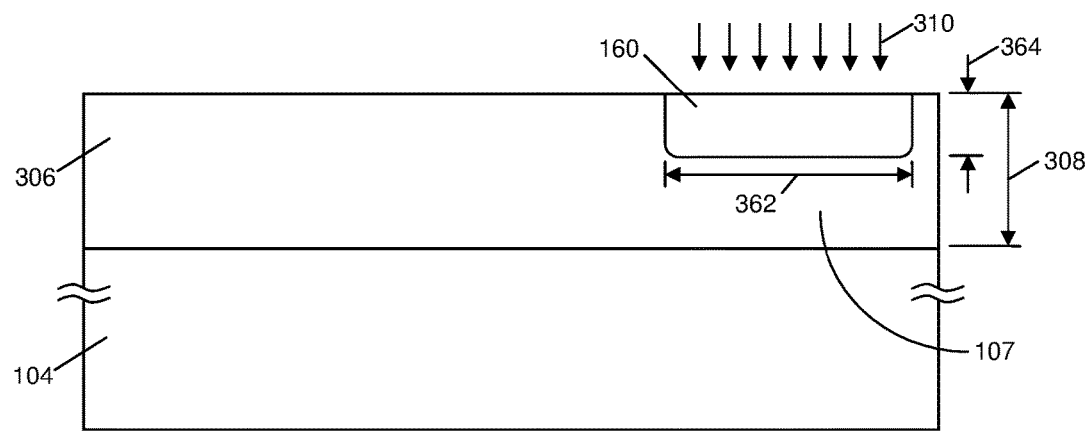
FIGS. 3-6 are cross-sectional side views of the device of FIG. 1 during various fabrication stages in accordance with an embodiment.

Referring to both FIGS. 2 and 3, the method may begin, in block 202 by forming (or "growing") a p-type epitaxial layer 306 on a p-type base semiconductor layer 104. For example, the p-type base semiconductor layer 104 may constitute a portion of a semiconductor wafer with an initial thickness of about 500 microns, although the initial thickness of the base semiconductor layer 104 may be thicker or thinner, as well. As discussed previously, the base semiconductor layer 104 may include heavily doped p-type semiconductor material (e.g., silicon or another semiconductor material), in an embodiment. In alternate embodiments, the base semiconductor layer 104 may be moderately doped, lightly doped, or un-doped, or may have an SOI or other substrate structure.

According to an embodiment, the epitaxial layer 306 may be grown to a thickness 308 in a range of about 5 microns to about 20 microns (e.g., about 13 microns), although the epitaxial layer 306 may be thicker or thinner, as well. The epitaxial layer 306 may be moderately or lightly doped p-type in-situ, in an embodiment. In an alternate embodiment, the epitaxial layer 306 may be deposited un-doped, and may thereafter be doped with a p-type dopant to a desired dopant concentration.

Blocks 204, 206, and 208 represent a process for forming one or more buried regions (e.g., regions 160, 162). Although block 204 may be performed just a single time to form a single buried region (and blocks 206 and 208 may be excluded), one or more iterations of the sequence of blocks 204, 206, and 208 may be performed to form multiple buried regions, as well. The below description corresponds to performing two iterations of the buried region formation processes, resulting in the formation of two buried regions. As indicated above, in alternate embodiments, only one iteration of block 204 may be performed to form one buried region, or more than two iterations of blocks 204, 206, 208 may be performed to form more than two buried regions.

In a first iteration of block 204, and still referring to FIG. 3, a first doped region 160 is formed, according to an embodiment. Although it is not buried at this stage, the first doped region 160 will be referred to as a first "buried" region (or lowest buried region) hereafter for consistency with the rest of the description, and because the first doped region 160 ultimately will be buried under additional epitaxially formed semiconductor material. To form the first buried region 160, a portion of the top surface of the epitaxial layer 306 is masked (mask not illustrated), and n-type dopant ions 310 are implanted into a portion of the surface of the epitaxial layer 306 that ultimately will align in the vertical direction with a later-formed drain region (e.g., drain region 140, FIG. 1). This results in an n-type buried region 160 at the surface of the epitaxial layer 306. According to an embodiment, the dopant ions 310 are implanted so that the first buried region 160 has a dopant concentration in a range of about $1.8 \times 10^{15}$ cm$^{-3}$ to about $2.1 \times 10^{15}$ cm$^{-3}$, and the dopant ions 310 are implanted using an ion energy in a range of about 500 kilo-electron volts (KeV) to about 800 KeV. In other embodiments, the dopant concentration and/or ion energy may be lower or higher than the above given ranges.

According to an embodiment, prior to or after further diffusion into the semiconductor substrate 102, the first buried region 160 has a width 362 in a range of about 1.0 microns to about 7.0 microns, where the width 362 depends on the drift length of the to-be-formed drift region 150 (i.e., the distance from sidewall 118 of the gate structure 110 to the gate-side edge of the to-be-formed drain region 140). For example, the width 362 of the first buried region 160 may be determined by a RESURF (REduced SURFace field) charge balance requirement for a particular device voltage rating (e.g., a higher voltage rating may warrant a longer drift length, and thus a relatively-wider width 362). According to an embodiment, the first buried region 160 has a thickness 364 in a range of about 0.5 microns to about 1.0 microns after initial implantation. However, the final thickness 364 of the first buried region 160 (i.e., after all thermal processes have been completed in conjunction with forming the device 100) may be in a range of about 1.5 microns to about 2.0 microns. The first buried region 160 may be wider or narrower and/or thicker or thinner, in other embodiments. In any event, the thickness 364 of the first buried region 160 is less than the thickness 308 of the epitaxial layer 306, in an embodiment, resulting in a first portion 107 of p-type semiconductor material underlying the first buried region 160 (i.e., between the first buried region 160 and the base substrate layer 104). According to an embodiment, the distance between the lower extent of the first buried region 160 and the base substrate layer 104 is in a range of about 30 microns to about 60 microns. A thermal process (e.g., an annealing step) may be performed after the implantation of block 204 in order to prepare the surface of the first buried region 160 for growth of additional epitaxial material above it. The thermal process also may result in diffusion of the n-type dopant from the first buried region 160 into surrounding portions of the first epitaxial layer 306, as indicated by the altered shape of buried region 160 in subsequent figures.

After formation of the first buried region 160, one or more additional buried regions may be formed, as indicated by decision block 206. For example, and referring now to FIG. 4, to form a second buried region (e.g., region 162) over the first buried region 160, a second (or next) p-type epitaxial layer 406 is formed on the first epitaxial layer 306 in block 208. According to an embodiment, the second epitaxial layer 406 may be thinner than the first epitaxial layer 306. For example, the second epitaxial layer 406 may be grown to a thickness 408 in a range of about 3 microns to about 6 microns (e.g., about 4 microns), although the epitaxial layer 406 may be thicker or thinner, as well. Once again, the epitaxial layer 406 may be moderately or lightly doped p-type in-situ, in an embodiment. In an alternate embodiment, the epitaxial layer 406 may be deposited un-doped, and may thereafter be doped with a p-type dopant to a desired dopant concentration.

Figure 4:
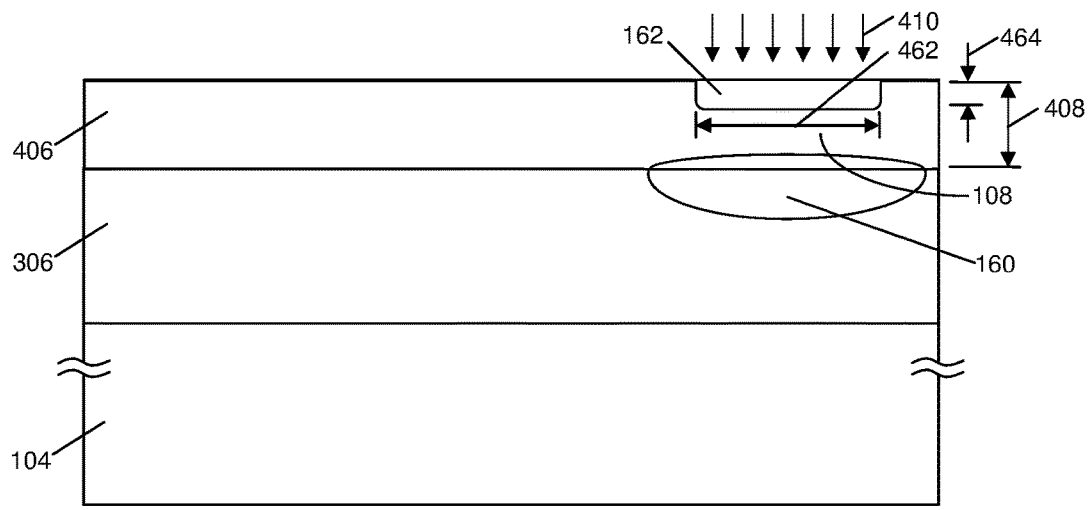

In a second iteration of block 204, and still referring to FIG. 4, a second doped region 162 (or upper buried region) is formed, according to an embodiment. To form the second buried region 162, a portion of the top surface of the epitaxial layer 406 is masked (mask not illustrated), and n-type dopant ions 410 are implanted into a portion of the surface of the epitaxial layer 406 that aligns with the first doped region 160 in the vertical direction, and that also will ultimately align in the vertical direction with a later-formed drain region (e.g., drain region 140, FIG. 1). This results in an n-type buried region 162 at the surface of the epitaxial layer 406. According to an embodiment, the dopant ions 410 are implanted so that the second buried region 162 has a dopant concentration in a range of about $1.8 \times 10^{15}$ cm$^{-3}$ to about $2.1 \times 10^{15}$ cm$^{-3}$, and the dopant ions 410 are implanted using an ion energy in a range of about 500 KeV to about 800 KeV. In other embodiments, the dopant concentration and/or ion energy may be lower or higher than the above given ranges.

According to an embodiment, prior to or after further diffusion into the semiconductor substrate 102, the second buried region 162 has a width 462 in a range of about 1.0 microns to about 5 microns, where the width 462 also depends on the drift length of the to-be-formed drift region 150, and may be determined by a RESURF charge balance requirement for a particular device voltage rating. According to an embodiment, the second buried region 162 has a thickness 464 in a range of about 0.5 microns to about 1.0 microns after initial implantation. However, the final thickness 464 of the first buried region 160 (i.e., after all thermal processes have been completed) may be in a range of about 1.0 microns to about 1.5 microns. The second buried region 162 may be wider or narrower and/or thicker or thinner, in other embodiments. As the above-given ranges indicate, the second buried region 162 may be narrower (in the horizontal direction) and thinner (in the vertical direction) than the first buried region 160. Alternatively, the first and second buried regions 160, 162 may have substantially similar dimensions, or the second buried region 162 may be wider and/or thicker than the first buried region 160. In any event, the depth 464 of the second buried region 162 is less than the thickness 408 of the epitaxial layer 406, in an embodiment, resulting in a second portion 108 of p-type semiconductor material underlying the second buried region 162 (i.e., between the first and second buried regions 160, 162). According to an embodiment, the distance between the lower extent of the second buried region 162 and the upper extent of the first buried region 160 is in a range of about 3 microns to about 5 microns. A thermal process (e.g., an annealing step) may be performed after the implantation of block 204 in order to prepare the surface of the second buried region 162 for growth of additional epitaxial material above it. The thermal process also may result in diffusion of the n-type dopant from the second buried region 162 into surrounding portions of the second epitaxial layer 406, and further diffusion of the n-type dopant from the first buried region 160 into surrounding portions of the first and second epitaxial layers 306, 406, as indicated by the altered shapes of buried regions 160, 162 in subsequent figures. Although buried regions 160, 162 are shown to be distinct regions (i.e., with p-type semiconductor material 108 between them), the implantation and thermal processes of block 204 may be carried out so that buried regions 160, 162 merge together, in an alternate embodiment.

Figure 5:
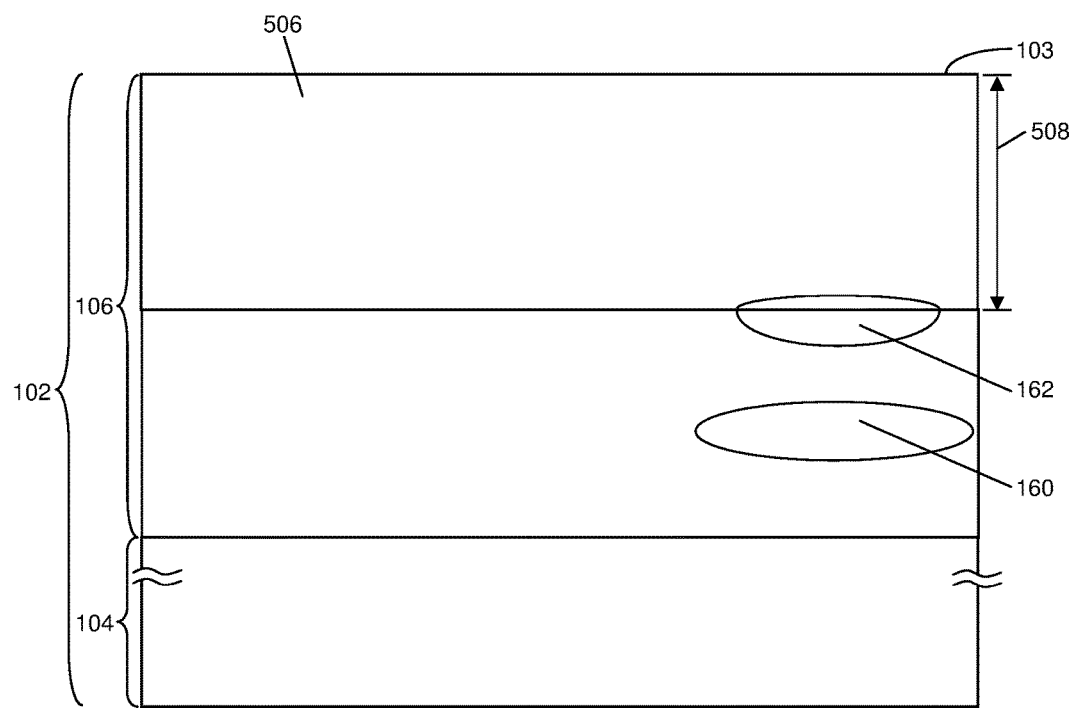

In block 210, and referring to FIG. 5, one or more additional (top) p-type epitaxial layers 506 (referred to in the singular, below) are formed on the second epitaxial layer 406. According to an embodiment, the top epitaxial layer 506 may be grown to a thickness 508 in a range of about 4 microns to about 8 microns (e.g., about 6 microns), although the epitaxial layer 506 may be thicker or thinner, as well. Once again, the epitaxial layer 506 may be moderately or lightly doped p-type in-situ, in an embodiment. In an alternate embodiment, the epitaxial layer 506 may be deposited un-doped, and may thereafter be doped with a p-type dopant to a desired dopant concentration. The top surface of epitaxial layer 506 corresponds to the top surface 103 of substrate 102. Although the above description indicates that a device may include three epitaxial layers 306, 406, 506, those of skill in the art would understand, based on the description herein, that the number of epitaxial layers 306, 406, 506 is not limited to three. In general, the number of epitaxial layers is directly related to the desired $BV_{dss}$ (e.g., the higher the $BV_{dss}$ is, the more epitaxial layers may be included).

Figure 6:
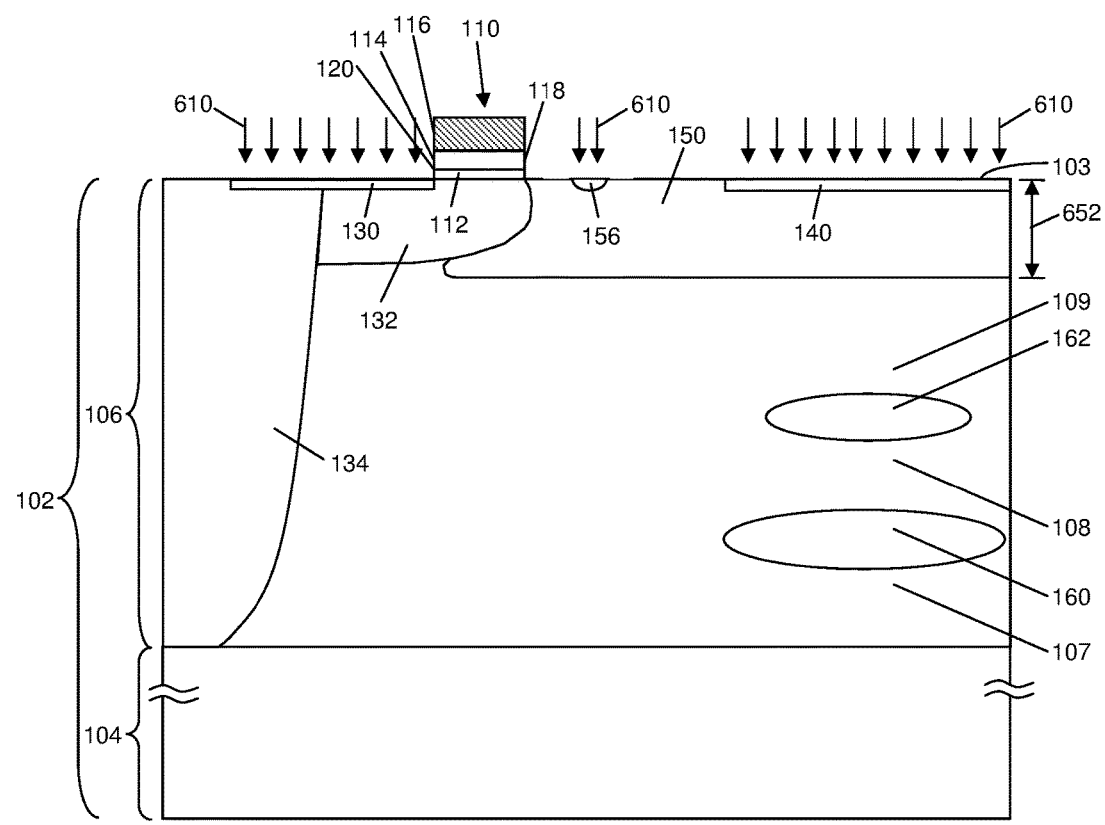

Referring now to FIG. 6 and block 212, the gate structure 110 and various doped regions 132, 134, 140, 150, 156 extending into the semiconductor substrate 102 from the top surface 103 of the semiconductor substrate 102 are formed. Although formation of the gate structure 110 and the various doped regions 132, 134, 140, 150, 156 are described in a particular order below, the gate structure 110 and the doped regions 132, 134, 140, 150, 156 may be formed in different orders, as well. Standard semiconductor processing techniques may be used to form the gate structure 110 and the various doped regions 132, 134, 140, 150, 156, and the details of those standard techniques are not discussed in detail herein.

The gate structure 110 is formed by sequentially forming a dielectric layer 112, a polysilicon layer 114, and a metal interconnect layer 116 on the top surface 103 of the semiconductor substrate 102, and performing a patterned etching process to define the gate structure 110. Semiconductor devices with a conductive gate electrode positioned over a dielectric or other insulator may be considered MOS devices despite the lack of a metal gate electrode and an oxide gate insulator. Commonly, the terms metal-oxide-semiconductor and the abbreviation "MOS" may be used even though such devices may not employ metals or oxides but various combinations of conductive materials (e.g., metals, alloys, silicides, doped semiconductors, etc., instead of simple metals, and insulating materials other than oxides). Accordingly, as used herein, the terms MOS and LDMOS are intended to include such variations.

To form sinker region 134, the top semiconductor surface 103 is masked (mask not illustrated) with an opening corresponding to the sinker region location. A p-type dopant (not illustrated) is then implanted in the semiconductor surface 103, where the implant process is configured to extend the sinker region 134 through all of the epitaxial layers 106 to reach the base semiconductor layer 104. In an alternate embodiment, the sinker region 134 may be formed during the epitaxial layer formation processes. According to an embodiment, the sinker region 134 has a dopant concentration in a range of about $1 \times 10^{19}$ cm$^{-3}$ to about $3 \times 10^{19}$ cm$^{-3}$, although the dopant concentration may be larger or smaller, as well.

To form the well region 132, the top semiconductor surface 103 again may be masked (mask not illustrated) with an opening at the source-side sidewall 120 of the gate structure 110, and a p-type dopant (not illustrated) is implanted into the semiconductor surface 103 through the opening. A drive procedure may then be performed to allow the well region 132 to extend a desired lateral distance under the gate structure 110 via lateral diffusion. In an alternate embodiment, the well region 132 may be implanted into the semiconductor substrate 102 prior to formation of the gate structure 110. According to an embodiment, the well region 132 has a depth in a range of about 0.6 microns to about 1.2 microns, and a dopant concentration in a range of about $3 \times 10^{16}$ cm$^{-3}$ to about $5 \times 10^{17}$ cm$^{-3}$, although the dopant concentration may be larger or smaller, as well.

The drift region 150 may be formed using one or multiple masking and implantation processes, which result in a drift region 150 with a desired thickness and shape, in an embodiment. Again, the top semiconductor surface 103 may be masked (mask not illustrated) with an opening at the drain-side sidewall 118 of the gate structure 110, and an n-type dopant is implanted into the semiconductor surface 103 through the opening. The drain-side sidewall 118 of the gate structure 110 may be used to align the drift region 150 with the gate structure 110, in an embodiment. In addition, a drive procedure may be performed to achieve a desired depth and dopant concentration profile for the drift region 150. According to an embodiment, the drift region 150 has a depth in a range of about 0.6 microns to about 3 microns, and a dopant concentration in a range of about $2.3 \times 10^{15}$ cm$^{-3}$ to about $9 \times 10^{16}$ cm$^{-3}$, although the dopant concentration may be larger or smaller, as well. According to an embodiment, the thickness 652 of the drift region 150 is less than the thickness 508 of the epitaxial layer 506, in an embodiment, resulting in a third portion 109 of p-type semiconductor material underlying the drift region 150 (i.e., between the drift region 150 and the second buried region 162). According to an embodiment, the distance between the lower extent of the drift region 150 and the upper extent of the second buried region 162 is in a range of about 5 microns to about 8 microns, and the distance between the drain region 140 and the upper extent of the second buried region 162 is in a range of about 8 microns to about 12 microns. These distances may depend, for example, on the device voltage rating. For example, the above-given ranges may be appropriate for devices with voltage ratings in a range of about 28 volts (V) to about 80 V with a $BV_{dss}$ in a range of about 70 V to about 250 V. In other embodiments, the voltage ratings may be higher or lower, and accordingly, the distance between the lower extent of the drift region 150 and the upper extent of the second buried region 162 (and/or the distance between the drain region 140 and the upper extend of the second buried region 162) may be greater or smaller than the above-given range.

One or more additional n-type implant processes are performed to form source, drain, and shield plate dopant regions 130, 140, 156. According to an embodiment, a mask layer (not illustrated) and the source-side sidewall 120 of the gate structure 110 may be used as a mask to align the source region 130 with the gate structure 110. One or more additional masks (not illustrated) may be used to define the locations of the drain and shield plate dopant regions 140, 156, and an n-type dopant 610 is implanted into the semiconductor surface 103 through the openings in the mask layer(s). One or more drive procedures may be used to achieve desired depths and dopant concentration profiles for the source, drain, and shield plate dopant regions 130, 140, 156. According to an embodiment, the source and drain dopant regions 130, 140 each has a depth in a range of about 0.2 microns to about 0.26 microns, and a dopant concentration in a range of about $1.0 \times 10^{20}$ $cm^{-3}$ to about $2.0 \times 10^{20}$ $cm^{-3}$, and the shield plate dopant region 156 has a depth in a range of about 0.2 microns to about 0.26 microns, and a dopant concentration in a range of about $1 \times 10^{16}$ $cm^{-3}$ to about $9.5 \times 10^{16}$ $cm^{-3}$. The depths and dopant concentrations of the source, drain, and shield plate dopant regions 130, 140, 156 may be larger or smaller than the above-given ranges, as well.

Referring again to FIG. 1 and block 214, a set of one or more shield plates, e.g., shield plates 122 and/or 124, and shield plate dielectric 170 are formed. In an embodiment, forming the set of shield plates 122, 124 includes forming a first dielectric layer of the shield plate dielectric 170 over the gate 110 and portions of the substrate surface 103, forming a lower shield plate 122 over the first dielectric layer, forming a second dielectric layer of the shield plate dielectric 170 over the lower shield plate 122, and forming an upper shield plate 124 over the second dielectric layer. Some example shield plate materials include, but are not limited to, doped polysilicon, metal-silicide including a tungsten silicide (e.g., WSi), a metal such as aluminum or copper, an alloy, or any other material or combination of materials that exhibits a desirable electrical conductivity. An additional dielectric layer may be formed over the upper shield plate 124, and the dielectric structure may be patterned and etched to complete the shield plate dielectric 170 with embedded shield plates 122, 124.

According to an embodiment, at least one of the shield plates 122, 124 has a portion that overlies the shield plate dopant region 156. In the embodiment shown, the upper shield plate 124 has an end that extends closer to the drain dopant region 140 than an end of the lower shield plate 122. Consequently, the upper shield plate 124 overlies or extends over a first portion of the drift dopant region 150 that is longer in length than a second portion of the drift dopant region 150 over which the lower shield plate 122 extends. Additionally, the upper 124 and lower 122 shield plates are physically and electrically isolated from each other with a layer of the shield plate dielectric 170. Although two shield plates 122, 124 are illustrated in FIG. 1, a device may include only a single shield plate or more than two shield plates, in other embodiments.

In block 216, conductive contacts 136, 142 are formed. For example, contact 136 is formed on the surface 103 to electrically connect to the source dopant region 130 and to the sinker region 134, and contact 142 is formed on the surface 103 to electrically connect to the drain dopant region 140. Various additional dielectric layers (not illustrated) and metal layers (not illustrated) are thereafter formed to complete the frontside of the device 100. In addition, the backside of the substrate 102 is thinned (e.g., using a backgrinding process) and backside contact 180 is formed on the back surface 105.

Figure 7:
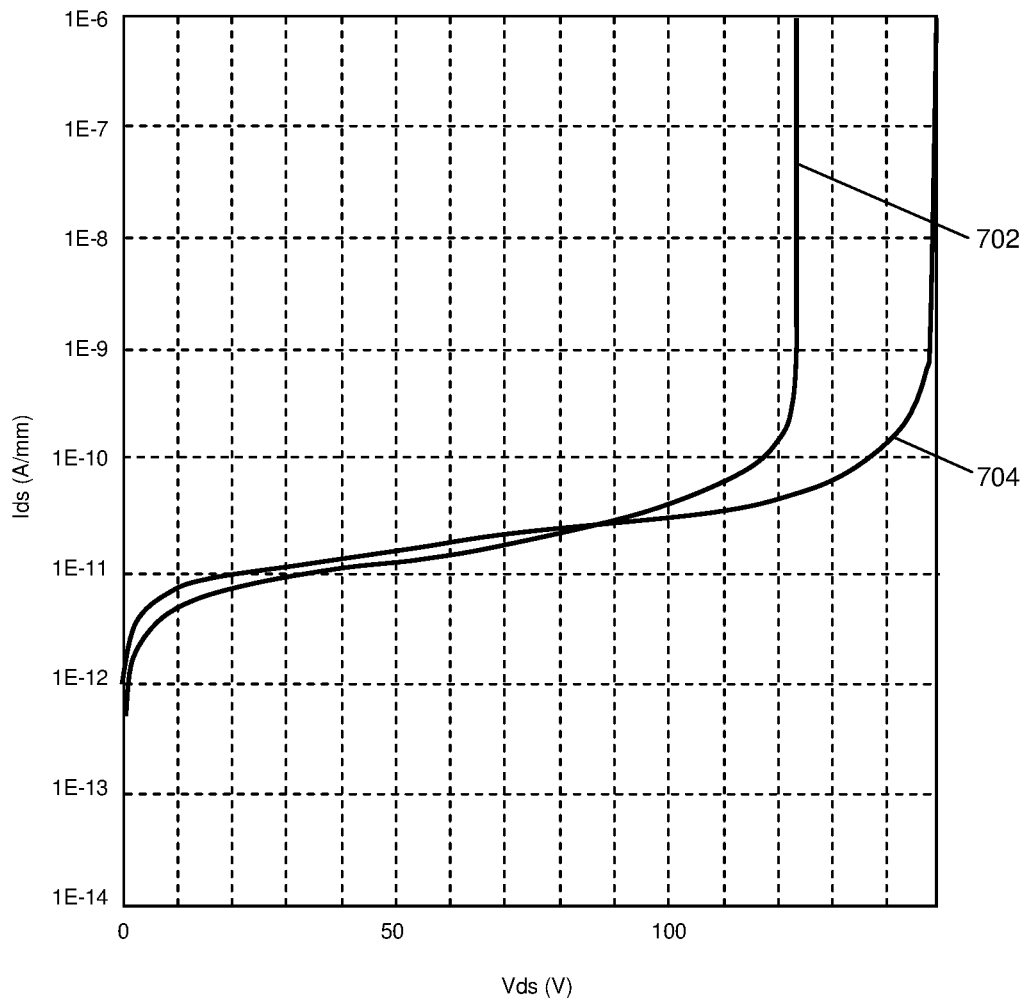
FIG. 7 is a plot of drain-source current versus drain-source voltage for devices with and without buried regions in the substrate underlying the drain region.

FIG. 7 shows a plot of drain-source current versus drain-source voltage illustrating breakdown voltages for (a) trace 902: a device that lacks buried regions (e.g., buried regions 160, 162) in the substrate underlying the drain region, and (b) trace 904: a device that includes buried regions (e.g., buried regions 160, 162) in the substrate underlying the drain region, in accordance with an embodiment. As shown in FIG. 7, a device that includes one or more buried regions underlying the drain region in accordance with an embodiment may have a substantially higher breakdown voltage than a device that lacks such buried region(s).

An embodiment of a semiconductor device includes a semiconductor substrate having a first conductivity type, a first surface, and an opposed second surface, a gate structure supported by the first surface of the semiconductor substrate, and a first current carrying region disposed in the semiconductor substrate at the first surface. The first current carrying region is laterally separated from the gate structure. The device further includes a drift region of a second conductivity type disposed in the semiconductor substrate at the first surface, where the second conductivity type is opposite the first conductivity type, and the drift region extends laterally from the first current carrying region to the gate structure. The device further includes a first buried region of the second conductivity type disposed in the semiconductor substrate below the first current carrying region. The first buried region is vertically aligned with the first current carrying region, and a first portion of the semiconductor substrate with the first conductivity type is present between the first buried region and the first current carrying region.

Another embodiment of a semiconductor device includes a substrate and a field-effect transistor device disposed in the substrate. The field-effect transistor device includes a semiconductor substrate having a first conductivity type, a first surface, and an opposed second surface, a gate structure supported by the first surface of the semiconductor substrate, and a drain region disposed in the semiconductor substrate at the first surface. The drain region is laterally separated from the gate structure. The field-effect transistor device further includes a drift region of a second conductivity type disposed in the semiconductor substrate at the first surface, where the second conductivity type is opposite the first conductivity type, and the drift region extends laterally from the drain region to a first edge of the gate structure. The field-effect transistor device further includes a first buried region of the second conductivity type disposed in the semiconductor substrate below the drain region. The first buried region is vertically aligned with the first drain region, and a first portion of the semiconductor substrate with the first conductivity type is present between the first buried region and the drain region.

An embodiment of a method of fabricating a semiconductor device includes forming a first epitaxial layer of a first conductivity type over a base semiconductor layer, and forming a first buried region in the first epitaxial layer, where the first buried region has a second conductivity type that is opposite the first conductivity type. The method further includes forming a second epitaxial layer of the first conductivity type over the first epitaxial layer, where a surface of the second epitaxial layer corresponds to a first surface of a semiconductor substrate. The method further includes forming a gate structure over the first surface of the semiconductor substrate, forming a source region and a drain region in the second epitaxial layer, and forming a drift region of the second conductivity type in the semiconductor substrate. The drift region extends laterally from the drain region to the gate structure, a first portion of the second epitaxial layer with the first conductivity type is present between the first buried region and the drift region, and the first buried region is vertically aligned with the drift region.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A semiconductor device comprising:
a semiconductor substrate having a first conductivity type, a first surface, and an opposed second surface;
a gate structure supported by the first surface of the semiconductor substrate;
a first current carrying region disposed in the semiconductor substrate at the first surface, wherein the first current carrying region is laterally separated from the gate structure;
a drift region of a second conductivity type disposed in the semiconductor substrate at the first surface, wherein the second conductivity type is opposite the first conductivity type, and the drift region extends laterally from a first side of the first current carrying region to the gate structure;
a second current carrying region disposed in the semiconductor substrate at the first surface, wherein the second current carrying region extends laterally from a second side of the gate structure opposite the first side, and the second current carrying region is electrically connected to the opposed second surface of the semiconductor substrate through a conductive path; and
a first buried region of the second conductivity type disposed in the semiconductor substrate below the first current carrying region, wherein the first buried region is vertically aligned with the first current carrying region, the first buried region does not extend into any portion of the semiconductor substrate directly underlying the gate structure, and a first portion of the semiconductor substrate with the first conductivity type is present between the first buried region and the first current carrying region, and wherein the first buried region is electrically floating.

2. The semiconductor device of claim 1, wherein:
the semiconductor substrate comprises a low resistivity base semiconductor layer and multiple epitaxial layers on a first surface of the base semiconductor layer, and wherein a surface of the epitaxial layers corresponds to the first surface of the semiconductor substrate; and
the conductive path comprises the base semiconductor layer and a sinker region extending through the epitaxial layers to the base semiconductor layer.

3. A semiconductor device comprising:
a semiconductor substrate having a first conductivity type, a first surface, and an opposed second surface;
a gate structure supported by the first surface of the semiconductor substrate;
a first current carrying region disposed in the semiconductor substrate at the first surface, wherein the first current carrying region is laterally separated from the gate structure;
a drift region of a second conductivity type disposed in the semiconductor substrate at the first surface, wherein the second conductivity type is opposite the first conductivity type, and the drift region extends laterally from a first side of the first current carrying region to the gate structure;
a second current carrying region disposed in the semiconductor substrate at the first surface, wherein the second current carrying region extends laterally from a second side of the gate structure opposite the first side, and the second current carrying region is electrically connected to the opposed second surface of the semiconductor substrate through a conductive path;
a first buried region of the second conductivity type disposed in the semiconductor substrate below the first current carrying region, wherein the first buried region is vertically aligned with the first current carrying region, and a first portion of the semiconductor substrate with the first conductivity type is present between the first buried region and the first current carrying region, and wherein the first buried region is electrically floating; and a well region in the semiconductor substrate under the gate structure, wherein the well region has a first depth, and wherein the drift region has a lower boundary that is at a second depth that is greater than the first depth of the well region.

4. The semiconductor device of claim 1, wherein the semiconductor substrate comprises a base semiconductor layer, a first epitaxial layer in which the first buried region is deposited, and a second epitaxial layer over the first epitaxial layer, wherein a surface of the second epitaxial layer corresponds to the first surface of the semiconductor substrate.

5. The semiconductor device of claim 1, wherein a distance between the first current carrying region and an upper extent of the first buried region is in a range of 8 microns to 12 microns.

6. A semiconductor device comprising:
a semiconductor substrate having a first conductivity type, a first surface, and an opposed second surface;
a gate structure supported by the first surface of the semiconductor substrate;
a first current carrying region disposed in the semiconductor substrate at the first surface, wherein the first current carrying region is laterally separated from the gate structure;
a drift region of a second conductivity type disposed in the semiconductor substrate at the first surface, wherein the second conductivity type is opposite the first conductivity type, and the drift region extends laterally from a first side of the first current carrying region to the gate structure;
a second current carrying region disposed in the semiconductor substrate at the first surface, wherein the second current carrying region extends laterally from a second side of the gate structure opposite the first side, and the second current carrying region is electrically connected to the opposed second surface of the semiconductor substrate through a conductive path;
a first buried region of the second conductivity type disposed in the semiconductor substrate below the first current carrying region, wherein the first buried region is vertically aligned with the first current carrying region, and a first portion of the semiconductor substrate with the first conductivity type is present between the first buried region and the first current carrying region, and wherein the first buried region is electrically floating; and
a second buried region of the second conductivity type disposed in the semiconductor substrate below the first buried region, wherein the second buried region is vertically aligned with the first buried region and the first current carrying region, and a second portion of the semiconductor substrate with the first conductivity type is present between the first and second buried regions.

7. The semiconductor device of claim 6, wherein a thickness of the second portion of the semiconductor substrate between the first and second buried regions is in a range of 3 microns to 5 microns.

8. The semiconductor device of claim 6, wherein the first buried region has a first width, and the second buried region has a second width that is wider than the first width of the first buried region.

9. The semiconductor device of claim 6, wherein the semiconductor substrate comprises a base semiconductor layer, a first epitaxial layer in which the first buried region is deposited, a second epitaxial layer over the first epitaxial layer and in which the second buried region is deposited, and a third epitaxial layer over the second epitaxial layer, wherein a surface of the third epitaxial layer corresponds to the first surface of the semiconductor substrate.

10. The semiconductor device of claim 9, wherein the first epitaxial layer has a thickness in a range of 9 microns to 13 microns, the second epitaxial layer has a thickness in a range of 3 microns to 5 microns, and the third epitaxial layer has a thickness in a range of 3 microns to 5 microns.

11. The semiconductor device of claim 6, further comprising:
one or more additional buried regions of the second conductivity type disposed in the semiconductor substrate directly below the first and second buried regions, wherein each of the first, second, and additional buried regions are separated by portions of the semiconductor substrate with the first conductivity type.

12. The semiconductor device of claim 6, further comprising:
a shield plate dopant region of the second conductivity type in the drift region between the gate structure and the first current carrying region, wherein a first dopant concentration of the shield plate dopant region is higher than a second dopant concentration of the drift region.

13. The semiconductor device of claim 6, wherein the first current carrying region is a drain region of a field-effect transistor device, and the second current carrying region is a source region of the field-effect transistor device.

14. A method of fabricating a semiconductor device, the method comprising:
forming a first epitaxial layer of a first conductivity type over a base semiconductor layer;
forming an electrically floating first buried region in the first epitaxial layer, wherein the first buried region has a second conductivity type that is opposite the first conductivity type;
forming a second epitaxial layer of the first conductivity type over the first epitaxial layer, wherein a surface of the second epitaxial layer corresponds to a first surface of a semiconductor substrate;
forming a gate structure over the first surface of the semiconductor substrate;
forming a source region and a drain region in the second epitaxial layer;
forming a drift region of the second conductivity type in the semiconductor substrate, the drift region extending laterally from the drain region to the gate structure, wherein a first portion of the second epitaxial layer with the first conductivity type is present between the first buried region and the drift region, and the first buried region is vertically aligned with the drift region;
forming a second current carrying region disposed in the semiconductor substrate at the first surface, wherein the second current carrying region extends laterally from a second side of the gate structure opposite the first side; and
forming a conductive path through the semiconductor substrate to electrically connect the second current carrying region to the opposed second surface of the semiconductor substrate.

15. The method of claim 14, wherein the forming the first buried region comprises:

masking at least a portion of the first epitaxial layer;
implanting a dopant having the second conductivity type in at least an unmasked portion of the first epitaxial layer, at least a portion of the unmasked portion being vertically aligned with the drain region;
performing a thermal process; and
forming the second epitaxial layer over the first epitaxial layer.

16. The method of claim 14, further comprising:
forming a third epitaxial layer of the first conductivity type between the base semiconductor layer and the first epitaxial layer; and
forming a second buried region in the third epitaxial layer, wherein the second buried region has the second conductivity type, a first portion of the first epitaxial layer with the first conductivity type is present between the first buried region and the second buried region, and the second buried region is vertically aligned with the first buried region and the drift region.

17. The method of claim 14, wherein the first buried region has a first width, and the second buried region has a second width that is wider than the first width of the first buried region.

18. The method of claim 14, wherein:
the semiconductor substrate comprises a low resistivity base semiconductor layer and the first and second epitaxial layers; and
forming the conductive path through the semiconductor substrate comprises forming a sinker region that extends through the epitaxial layers to the base semiconductor layer.

19. The method of claim 14, further comprising:
forming a shield plate dopant region of the second conductivity type in the drift region between the gate structure and the first current carrying region, wherein a first dopant concentration of the shield plate dopant region is higher than a second dopant concentration of the drift region.

20. The method of claim 14, further comprising:
forming a well region in the semiconductor substrate below the gate structure, the well region configured to form a channel between the source region and the drift region during operation of the semiconductor device, wherein the well region has a first depth, and wherein the drift region has a lower boundary that is at a second depth that is greater than the first depth of the well region.

* * * * *